US012396122B2

United States Patent
Tsorng et al.

(10) Patent No.: US 12,396,122 B2
(45) Date of Patent: Aug. 19, 2025

(54) MODULAR SUPPORT FOR TELECOMMUNICATION COMPONENT

(71) Applicant: Quanta Computer Inc., Taoyuan (TW)

(72) Inventors: Yaw-Tzorng Tsorng, Taoyuan (TW);
Ming-Lung Wang, Taoyuan (TW);
Nan-Chun Wu, Taoyuan (TW);
Wei-Kang Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 212 days.

(21) Appl. No.: 18/220,640

(22) Filed: Jul. 11, 2023

(65) Prior Publication Data
US 2025/0024629 A1 Jan. 16, 2025

(51) Int. Cl.
*H05K 7/18* (2006.01)
*H05K 7/20* (2006.01)

(52) U.S. Cl.
CPC .......... *H05K 7/186* (2013.01); *H05K 7/2039* (2013.01)

(58) Field of Classification Search
CPC ..... H05K 7/186; H05K 7/2039; H05K 5/0234
See application file for complete search history.

(56) References Cited

U.S. PATENT DOCUMENTS

| | | | | |
|---|---|---|---|---|
| 7,703,736 B2* | 4/2010 | Oh | ......... | F16M 11/38 |
| | | | | 16/221 |
| 8,922,995 B2* | 12/2014 | Su | ......... | H05K 5/0234 |
| | | | | 361/679.55 |
| 8,960,634 B2* | 2/2015 | Le Gette | ......... | F16M 11/041 |
| | | | | 248/176.1 |
| 12,196,357 B2* | 1/2025 | Kim | ......... | H05K 5/0234 |
| 12,242,311 B2* | 3/2025 | Saito | ......... | H05K 5/0234 |
| 2024/0107693 A1* | 3/2024 | Cho | ......... | G06F 1/1601 |

\* cited by examiner

*Primary Examiner* — Imani N Hayman
*Assistant Examiner* — Hung Q Dang
(74) *Attorney, Agent, or Firm* — NIXON PEABODY LLP

(57) ABSTRACT

An attachable support module for attachment to an electronic equipment casing. The support module allows the electronic equipment casing to be raised from a ground surface to allow cables to be attached to the underside of the casing. The support module includes a case having an exterior plate and a parallel interior plate. A support member is rotatably mounted between the exterior plate and the interior plate of the case. The support member has a collapsed position within the case and an extended position extending from the case. A pivot arm engages the support member in the collapsed position.

20 Claims, 11 Drawing Sheets

MODULAR SUPPORT FOR TELECOMMUNICATION COMPONENT

TECHNICAL FIELD

The present disclosure relates generally to a mounting structure for telecom components. More particularly, aspects of this disclosure relate to a compact supporting module that may be attached to a telecommunication casing for elevating the casing.

BACKGROUND

The fifth generation of mobile communication technology (5th generation wireless systems, referred to as 5G) is the latest generation of mobile communication technology. The 5G technology is an extension of legacy 4G (LTE) mobile communication systems. The recent roll out of the 5G communication infrastructure has required the deployment of 5G capable components. The previous 4G system required a baseband unit (BBU), a remote radio unit (RRU), and an antenna to allow for communications between mobile devices. 5G systems for communication between mobile devices have higher speeds, lower latency, and larger bandwidths, allowing for more connections and for more data to be processed. Such capabilities are possible through fan-less components such as radio units (RU), centralized units (CU), distributed units (DU), and active antenna units (AAU). In 5G systems the functions of the BBU in 4G systems are performed by the distributed units and centralized units, and the functions of the antenna and the RRU in 4G systems are performed by the active antenna units.

5G DUs and AAUs are components that are typically located in outdoor environments. Outdoor electronic chassis design for DUs and AAUs requires being waterproof, dustproof, and anti-corrosive. Therefore, the chassis for 5G outdoor components is designed as a closed system and the chassis is usually designed as a heat sink to cool the electronic devices in such components. Such thermal solutions are thus a fan-less design. A 5G case typically is roughly rectangular in shape with heat sink vanes on the top and the sides of the casing. The casing houses various electronic components for 5G communication operations. The casing has an input/output (IO) panel that includes ports for connection of various cables for power and signals to the electronic components. The panel is typically on the bottom side of the case to allow maximum exposure of the heat sink vanes.

Due to the location of the cable connections, 5G units require supports that may be used to raise the casing and thus allow access to the ports on the panel on the casing. Typically, these supports are installed near the bottom of the unit. There are two types of known bottom side supports for elevating 5G units. A first type is an integrated type where the supporter is designed in the system case as shown in a prior art telecommunication component 10 in FIG. 1A. In this example, the component 10 is offered by Sumitomo Electric. A second type is an independent type that fixes the supporter to the system case of a prior art telecommunication component 50 as shown in FIG. 1B. In this example, the component 50 is offered by Nokia. However, both types of existing supports have shortcomings.

An integrated type of supporter that is built into the 5G component 10 is shown in FIG. 1A. The 5G component has a casing 12 has with two side panels 14 and 16. Each of the side panels 14 and 16 has supports 18 that allow the casing 12 to be raised off of the ground. This allows access for connection of cables to a bottom input/output panel 20. The supports 18 will be scratched or damaged after frequent use. Thus, this will impact the appearance quality of the 5G unit and will require replacement of the support 18. However, an integrated type of support 18 is difficult and expensive to replace as the entire casing must be replaced if a single supporter 18 is damaged.

FIG. 1B shows the 5G component 50 that includes a casing 52. Two independent types of supports 60 and 62 are attached to the casing 52. One of the independent supports 60 has a longitudinal support and a plate that may be screwed into the casing 52. The other independent support 62 is a leg that may be attached to the casing 52 on an opposite side. The independent type of support suffers from the inability to be collapsed since once the supports 60 and 62 are attached, they cannot be easily retracted. Thus, if the component 50 is moved, the independent supports must be either detached or the fixed position of the supports extending from the casing 52 makes transport of the component 50 awkward. Further, the necessity for attaching the independent type of support to the system casing may require that the attached support overlaps the operating area near the front IO panel.

Thus, there is a need for a modular support that may be attached to a telecommunications component. There is a further need for a modular support that may be collapsed easily for transport. There is also a need for a modular support that allows replacement without the expense of replacing the main components of the telecommunication component.

SUMMARY

One disclosed example is an attachable support module for attachment to an electronic equipment casing. The support module includes a case having an exterior plate and a parallel interior plate. A support member is rotatably mounted between the exterior plate and the interior plate of the case. The support member has a collapsed position within the case and an extended position extending from the case. A pivot arm engages the support member in the collapsed position.

A further implementation of the example attachable support module includes a torsion spring having a first spring arm coupled to the support member and a second spring arm coupled to the pivot arm. The torsion spring provides spring force to force the support member into the extended position. Another implementation is where the support member includes a main hook that engages a secondary hook of the pivot arm. The engagement of the main hook with the secondary hook retains the support member in the collapsed position. Another implementation is where the pivot arm includes a release button. Pushing the release button causes the pivot arm to move and disengage the secondary hook from the main hook. Another implementation is where the support member includes a base member to engage a ground surface when the support member is in the extended position. Another implementation is where the support member includes a pivot bar positioned parallel to the base member. The pivot bar includes a hole with a pin inserted therein, and the support member rotates around the pin attached to the exterior and interior plates of the case. Another implementation is where the interior plate includes a fastener for fastening the case to a side panel of the electronic equipment casing. Another implementation is where the casing holds components for operation of a 5G mobile communication system, and where the casing includes an underside panel having an input/output connector that may be accessed when the support member is in an extended position.

Another disclosed example is an electronic component including a casing having two side panels and a bottom panel including at least one connector. The component includes a first modular support attached to one of the side panels and a second modular support attached to the other side panel. The first and second modular supports each include a case having an exterior plate and a parallel interior plate. The modular supports each include a support member rotatably mounted between the exterior plate and the interior plate of the case. The support member has a collapsed position within the case and an extended position extending from the case. The casing is elevated when the support member is in an extended position allowing access to the bottom side input/output panel. Each of the modular supports include a pivot arm engaging the support member in the collapsed position.

A further implementation of the example electronic component is where casing includes a heat sink chassis with cooling fins extending from an exterior surface of the heat sink chassis. The heat sink chassis is positioned between the two side panels. Another implementation is where the casing holds components for operation of a 5G mobile communication system. Another implementation is where the first and second modular supports each include a torsion spring having a first spring arm coupled to the support member and a second spring arm coupled to the pivot arm. The torsion spring provides spring force to force the support member into the extended position. Another implementation is where the support member includes a main hook that engages a secondary hook of the pivot arm. The engagement of the main hook with the secondary hook retains the support member in the collapsed position. Another implementation is where the pivot arm includes a release button. Pushing the release button causes the pivot arm to move and disengage the secondary hook from the main hook. Another implementation is where the support member includes a base member to engage a ground surface when the support member is in the extended position. Another implementation is where the support member includes a pivot bar positioned parallel to the base member. The pivot bar includes a hole. The support member rotates around a pin inserted therein. The pin is attached to the exterior and interior plates of the case. Another implementation is where the interior plate includes a fastener for fastening the case to one of the side panels.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
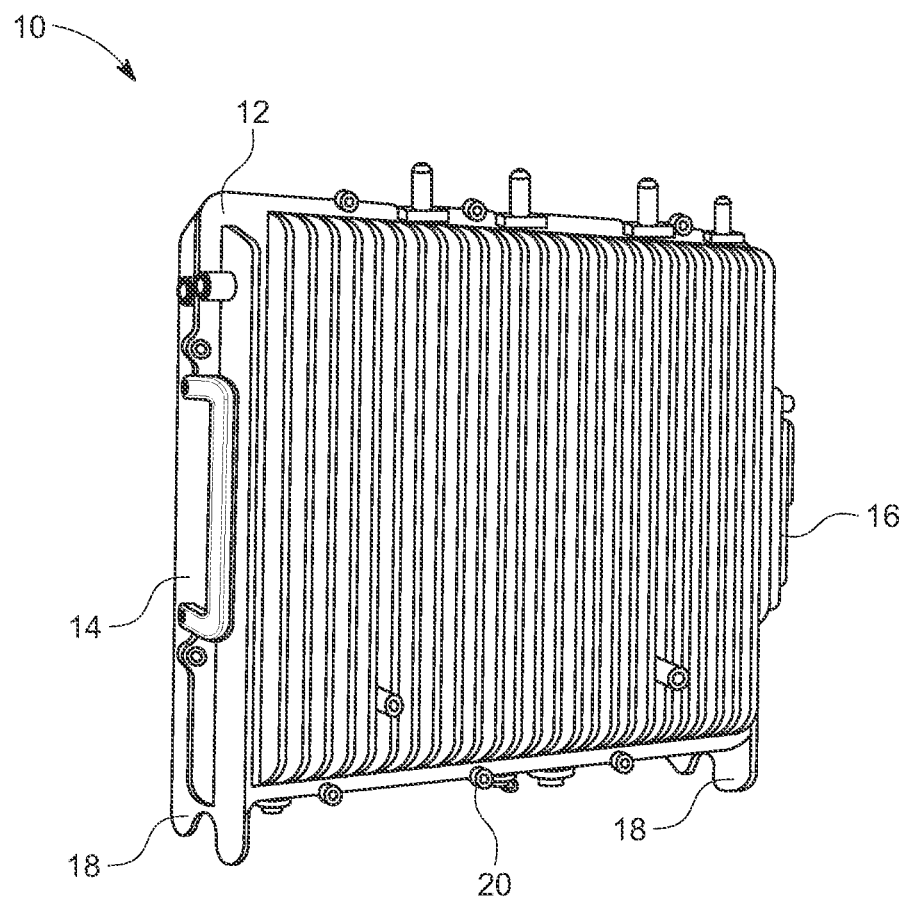
FIG. 1A is a perspective view of a telecommunications component casing with an integrated prior art support.
Figure 1B:
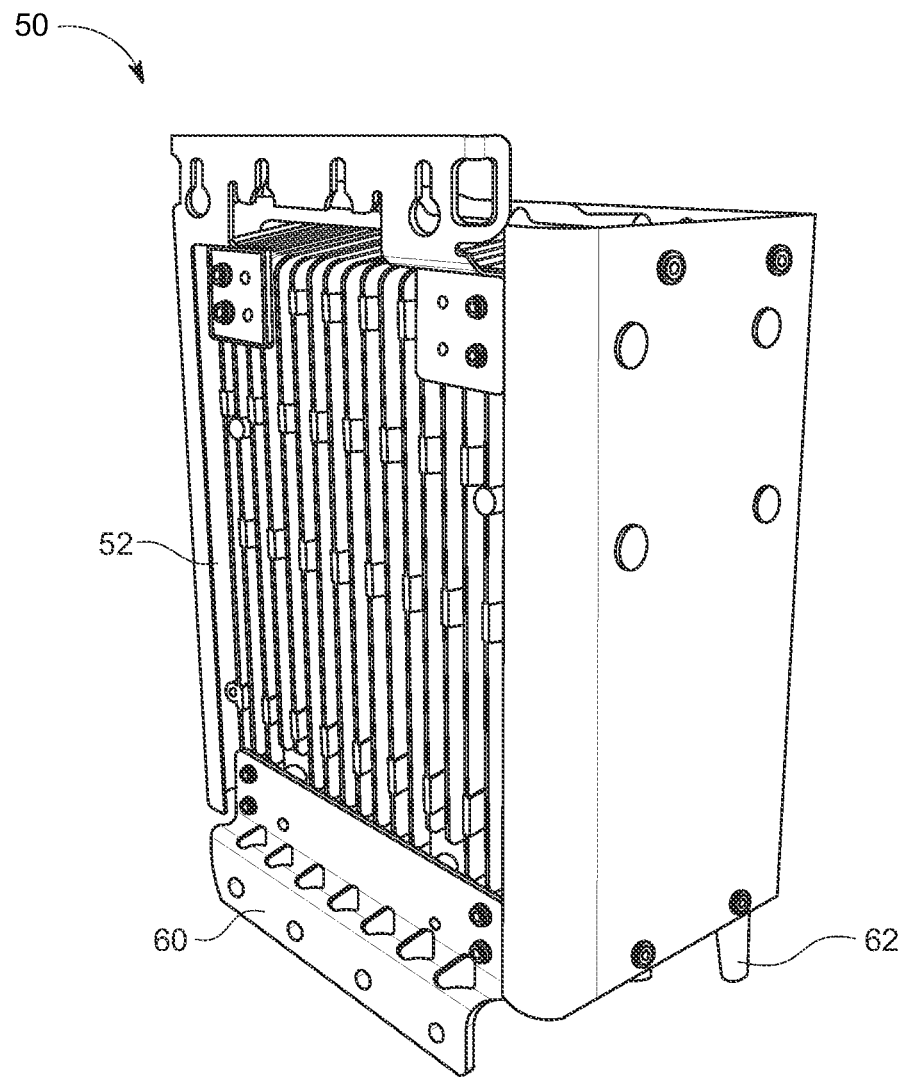
FIG. 1B is a perspective view of a telecommunications component casing with an independent prior art support.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

The present disclosure relates to an example support module for a telecommunication component casing. The example support module has an independent support member that may be collapsed for storage and extended to raise the casing. The support module includes an activation button that allows a user to either extend the support member or collapse the support member. The example support modules may be attached to a variety of telecommunication products, such as 4G/5G telecommunication devices, wall mount servers, and other wall mount devices. The example support modules have easy to open and collapse support members that facilitate use in an outdoor environment. The support members may be deployed quickly in the outdoor environment. When the support members are extended, workers have more space to install cables to the underside of the telecommunication casing. Since the support modules are detachable, they are easy to replace and maintain.

Figure 2A:
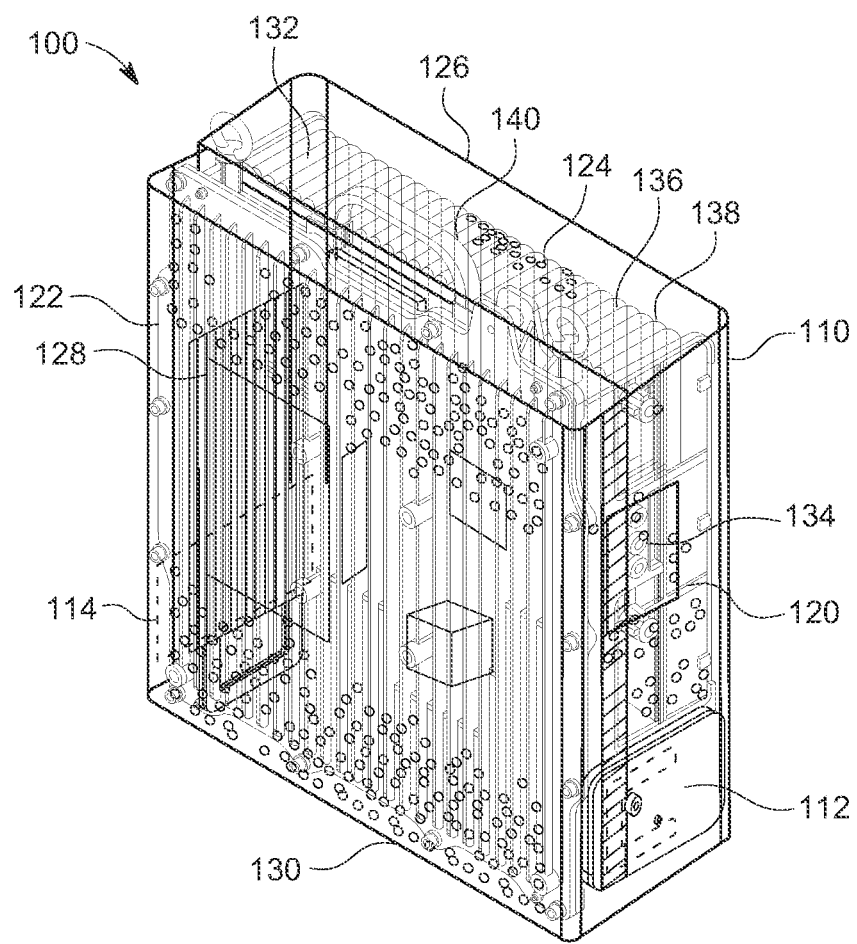
FIG. 2A shows a front perspective view of a telecommunications component with example support modules, according to certain aspects of the present disclosure.

FIG. 2A shows a perspective view of a telecommunication device 100. The device 100 has a casing 110 with two attached support modules 112 and 114. In this example, supports of the support modules 112 and 114 may be collapsed for storage of the telecommunication device 100. As shown in a perspective view in FIG. 2B and a side view in FIG. 2C, when the telecommunication device 100 is deployed, support members of the support modules 112 and 114 may be extended to support the telecommunication device 100. The extended support members raise the telecommunication device 100 off a ground surface and allows cables to be attached to the underside of the casing 110. In this example, the support modules 112 and 114 may support weight of up to 20 kilograms. Of course, the same design principles may be used for similar support modules to support heavier equipment.

The casing 110 has two side support panels 120 and 122 and a front end 124. The two side support panels 120 and 122 and the front end 124 are covered by a shield housing 126 (not shown in FIGS. 2B-2C for clarity) that is joined to a rear panel 128. An underside input/output panel 130 encloses the bottom edges of the rear panel 128 and the shield housing 126. The casing 110 has an open top end 132. The side panels 120 and 122 have upper areas that have certain connectors 134 that may be accessed through apertures formed through the shield housing 126. A heat sink chassis 136 is located between the side support panels 120 and 122. Heat sink fins 138 extend from the front end 124 and the open top end 132. A handle 140 is mounted on the top end 132 to allow easier carrying of the casing 110. The underside input/output panel 130 has a series of connectors 142 for different cables that provide power and data signals to the device 100.

The telecommunication equipment device 100 is a fanless electronic device. In this example, the telecommunication device 100 is a 5G distributed unit (DU). The casing 110 holds a printed circuit board and other electronic components for performing 5G communication functions. The example support modules may be used for any similar devices, such as other 5G telecommunication components (such as a radio unit (RU), or an active antenna unit (AAU)). In this example, the DU component is part of a 5G mobile communication system that relies on electronic components that require heat dissipation for proper operation.

The electronic components will typically include a processor, such as a CPU, double data rate (DDR) memory, physical layer key generation circuits, network interfaces, power supply, and other components. The connectors may include small form-factor pluggable (SFP) optical and RJ45 type connectors. The components inside the casing 110 generate heat, which are absorbed by the heat sink chassis 136.

The heat sink chassis 136 allows transmission of heat generated by the internal electronics of the telecommunication device 100 to the ambient exterior environment. The external fins 138 assist in dissipating the ambient heat to the external environment. In this example, the chassis 136 and fins 138 are constructed of heat absorbent material such as aluminum or aluminum alloy. A part of the interior surface of the heat sink chassis 136 may serve as a contact surface in thermal communication with components on the circuit board such as a CPU. Heat is funneled from the interior surface to an opposite exterior surface of the heat sink chassis. The vertical fins 138 extend from the exterior surface of the heat sink chassis 136. The vertical fins 138 increase the surface area available to dissipate heat from the heat sink chassis 136 to the ambient environment.

Figure 2B:
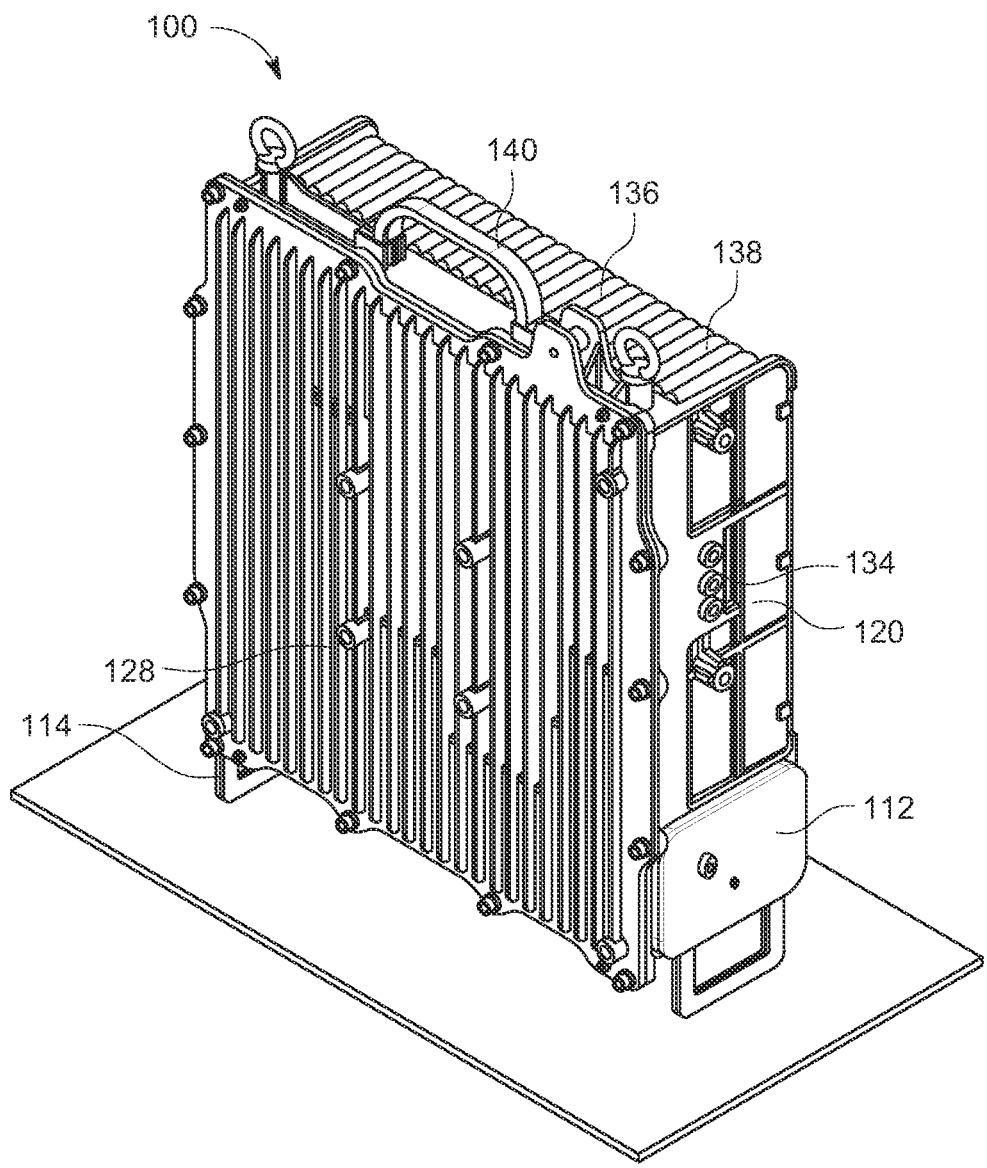
FIG. 2B shows a front perspective view of the telecommunications component with the example support modules in FIG. 2A having supports extended to allow cables to be attached to the underside of the telecommunications component, according to certain aspects of the present disclosure.
Figure 2C:
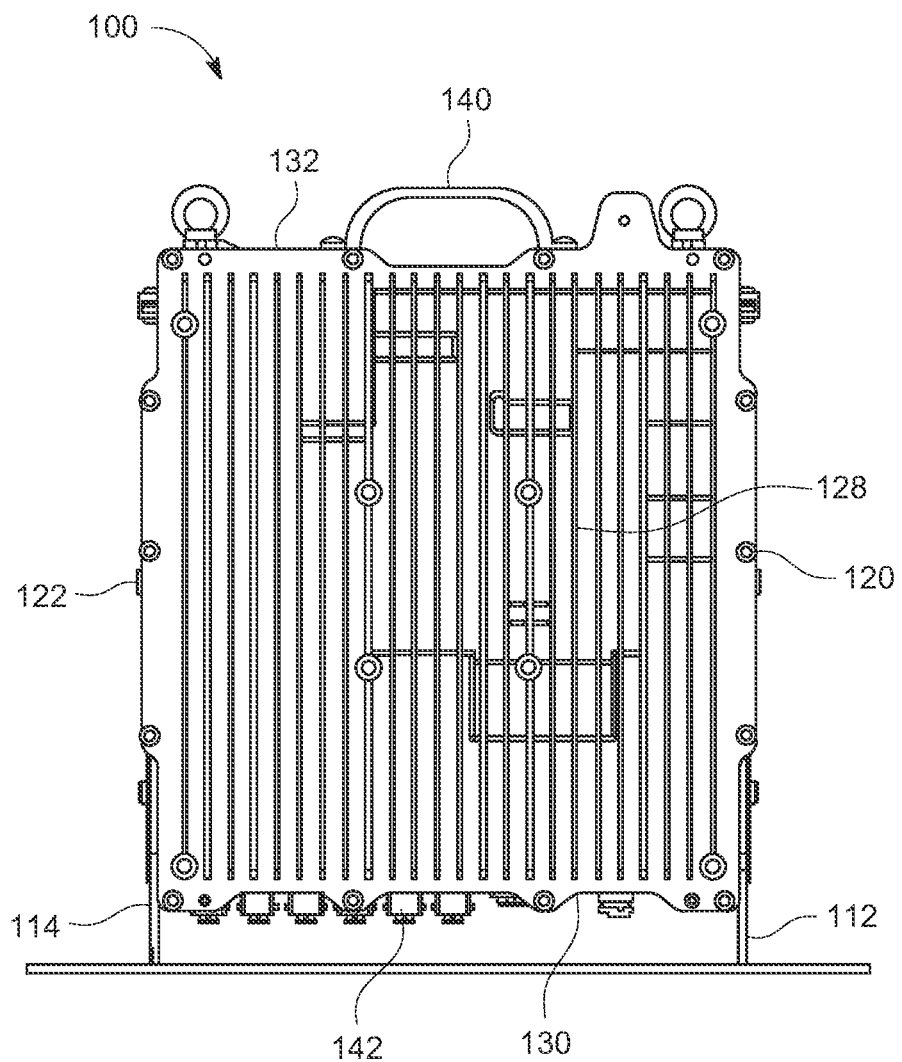
FIG. 2C shows a side view of the telecommunications component with the example support modules having supports extended to allow cables to be attached, according to certain aspects of the present disclosure.
Figure 3A:
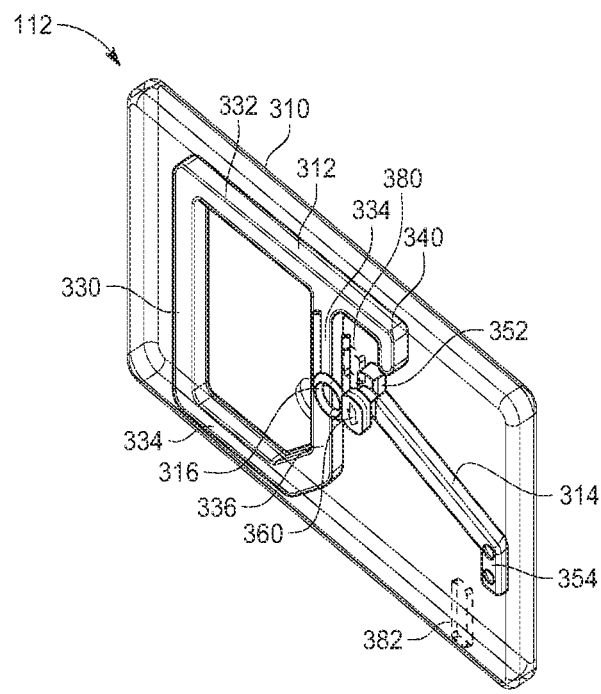
FIG. 3A is a perspective view of one of the example support modules shown in FIGS. 2A-2B, according to certain aspects of the present disclosure.
Figure 3B:
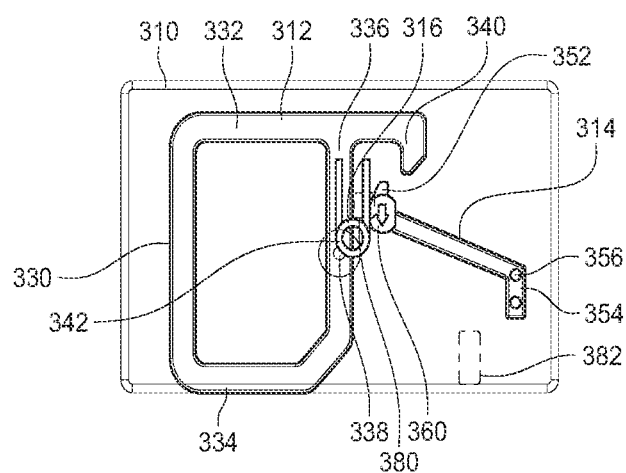
FIG. 3B is a side view of one of the example support modules in FIGS. 2A-2B, according to certain aspects of the present disclosure.
Figure 3C:
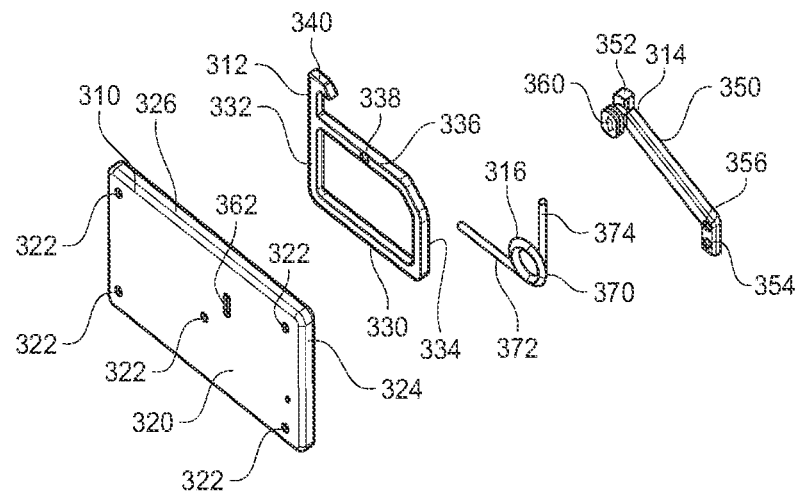
FIG. 3C is an exploded view of the components of the example support module, according to certain aspects of the present disclosure.

FIG. 3A is a perspective view of the components of the example supporter module such as the support module 112 in FIGS. 2A-2C. FIG. 3B is a side view of the components of the example support module 112. FIG. 3C is an exploded 3-D perspective view of the four components of the example support module such as the support module 112 in FIGS. 2A-2B. The support module 112 includes a module case 310, a support member 312, a switch arm 314, and a torsion spring 316. The module case 310 holds the support member 312, switch arm 314, and torsion spring 316. The module case 310 includes fastening systems such as holes for screws or rivets that allow easy attachment and detachment from one of the side panels 120 and 122 of the casing 110. In this example, the module case 310, support member 312 and switch arm 314 are fabricated from die casting aluminum. Of course other appropriate fabrication techniques and materials may be used.

The module case 310 includes an exterior plate 320 that includes a series of screw holes 322 that allows the attachment of the module case 310 to the side panel 120. The screw holes 322 include a center hole and four holes near each of the corners of the exterior plate 320. A parallel interior plate 324 is attached to the exterior plate 320 by a side border 326. Screws are inserted into each of the holes 322 to secure the exterior plate 320 to the interior plate 324. The support member 312 has a rectangular frame shape that includes a bottom support member 330. The bottom support member 330 is attached to two post supports 332 and 334. A pivot bar 336 is attached to the opposite ends of the supports 332 and 334 to define the frame shape. A hole 338 is formed through the pivot bar 336. A main hook 340 extends from the end of the support 332. The pivot bar 336 rotates on a pin 342 that is inserted through the hole 338 and is supported between the plates 320 and 324 of the module case 310. In this example, the bottom support member 330 and post supports 332 and 334 may be extended by 2.5-4.0 cm from the bottom of the case 310.

The switch arm 314 has an arm member 350. One end of the arm member 350 is attached to a secondary hook 352 that engages with the main hook 340 of the support member 312. The opposite end of the arm member 350 is connected to an angled stub 354. A hole 356 is formed on the end of the arm member 350 connected to the angled stub 354. The arm member 350 is mounted to rotate around a pin 358 that is inserted in the hole 356. The pin 358 is supported between the plates 320 and 324 of the module case 310. A switch button 360 extends from one end of the arm member 350. The switch button 360 may be moved in a vertical direction in a slot 362 on the exterior plate 320.

The torsion spring 316 has a main coil 370 that is attached to a first spring arm 372 and a second spring arm 374. The first spring arm 372 is attached to the pivot bar 336 of the support member 312. The second spring arm 374 is placed in contact with the end of the secondary hook 352 of the switch arm 314. When the support member 312 of the support module 112 is in the collapsed position, the support member 312 is held in place by the engagement of the main hook 340 to the secondary hook 352 as shown in FIGS. 3A-3B. An interior block 380 extends from the interior surface of the exterior plate 320. The pivot bar 336 of the support member 312 contacts the interior block 380 to assist in keeping the support member 312 in the collapsed position. The main coil 370 is mounted on a screw that is inserted in the center screw hole 322 in the plate 320 attached to the interior plate 324.

When the support member 312 is in the collapsed position, the torsion spring 316 will be compressed. The spring force from the torsion spring 316 is restrained by the engagement of the main hook 340 with the secondary hook 352. Thus, when the switch button 360 is pushed in a downward direction, the main hook 340 is released from the secondary hook 352. The spring force from the torsion spring 316 forces the support member 312 to rotate to the extended position. The torsion spring 316 installed to the support member 312 thus pushes the support member 312 to achieve automatic operation to the extended position for supporting the casing.

Figure 4A:
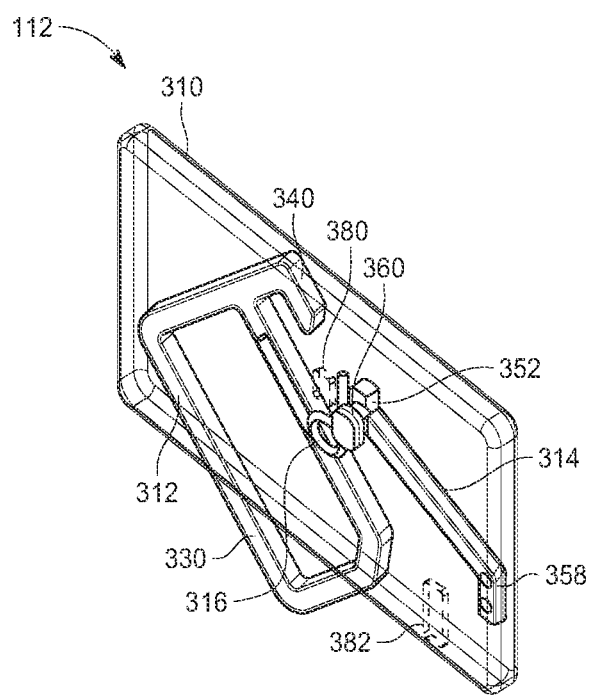
FIG. 4A shows a perspective view of the support module with the support being deployed, according to certain aspects of the present disclosure.
Figure 4B:
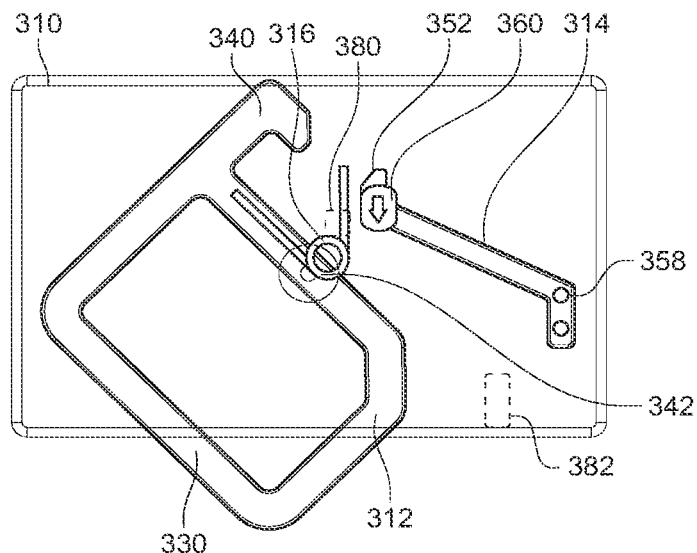
FIG. 4B shows a side view of the support module with the support being deployed in FIG. 2A, according to certain aspects of the present disclosure.

By pushing the switch button 360 downward, the switch arm 314 pivots around the pin 358. When the switch arm 314 pivots, the secondary hook 352 moves downward and disengages from the main hook 340 as shown in FIGS. 4A-4B. The spring force from the compressed torsion spring 316 forces the support member 312 to rotate counter-clockwise around the pin 342. This swings the bottom support member 330 from a vertical orientation to a horizontal orientation to the bottom edge of the case 310.

Figure 5A:
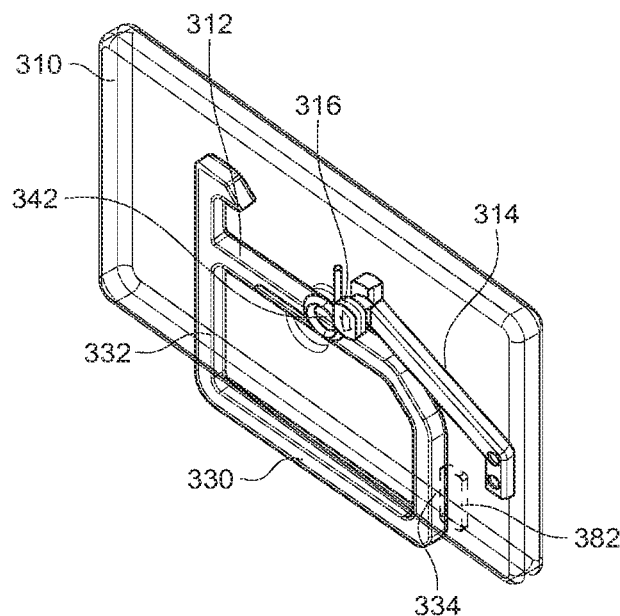
FIG. 5A shows a perspective view of the example support module with the support in the extended position, according to certain aspects of the present disclosure.
Figure 5B:
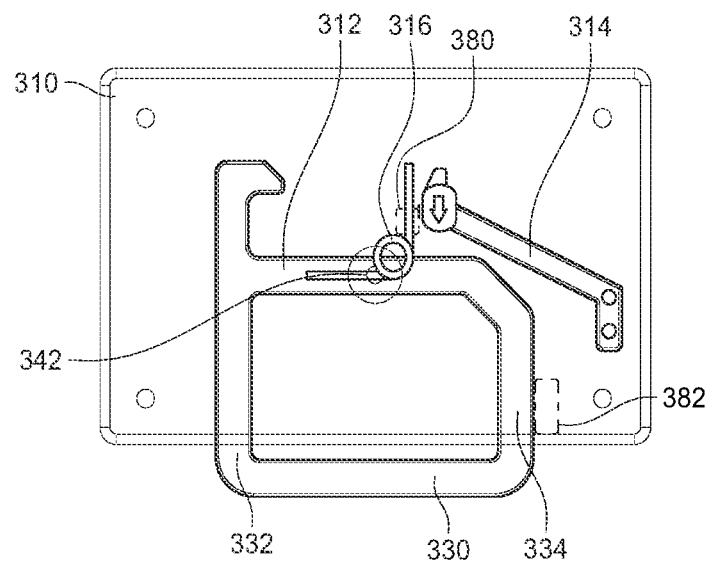
FIG. 5B shows a side view of the example support module with the support in the extended position, according to certain aspects of the present disclosure.

Once the bottom support member 330 is rotated in a horizontal orientation as shown in FIGS. 5A-5B, the bottom support member 330 is extended from the bottom of the case 310 through the post supports 332 and 334. The support member 312 is thus in the extended position and raises the telecommunication device 100 in FIG. 2B from a ground surface to allow access to the underside input/output panel 130. In the extended position, the support 334 of the support member contacts a bottom block 382 that extends from the interior surface of the exterior panel 320. The support member 312 is thus held in the extended position by the spring force from the torsion spring 316 and the block 382.

Figure 6A:
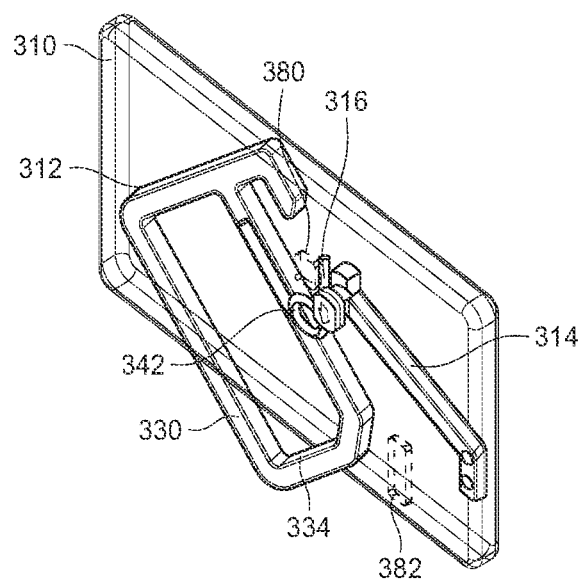
FIG. 6A shows a perspective view of the example support module with the support being unlocked for collapsing into the support module, according to certain aspects of the present disclosure.
Figure 6B:
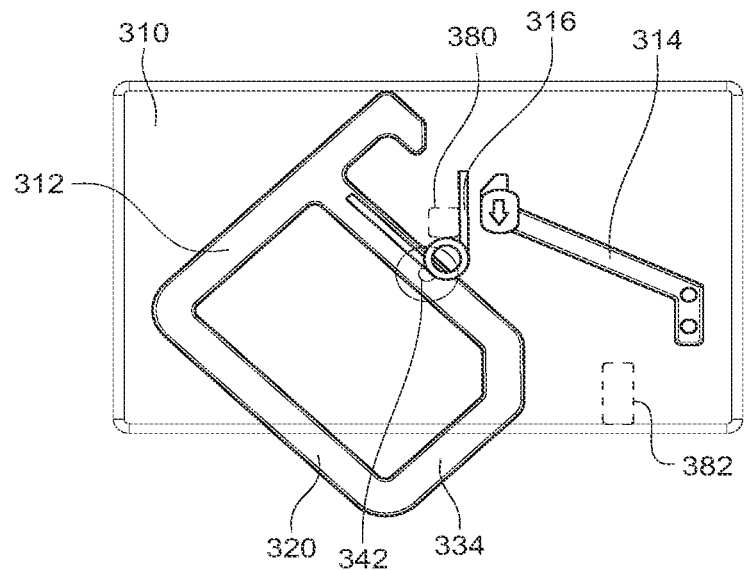
FIG. 6B shows a side view of the example support module with the support being unlocked for collapsing into the support module, according to certain aspects of the present disclosure.
Figure 7A:
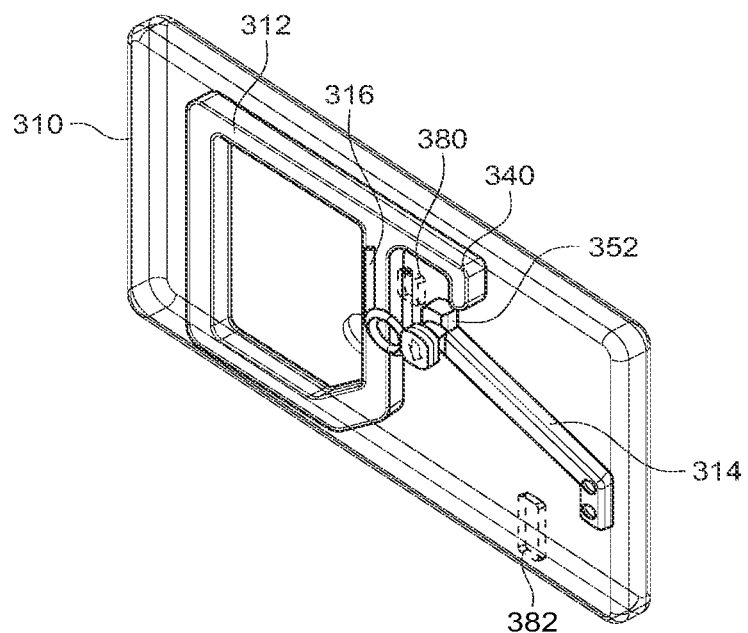
FIG. 7A shows a perspective view of the example support module, where the support is in the process of being locked into the collapsed position, according to certain aspects of the present disclosure.
Figure 7B:
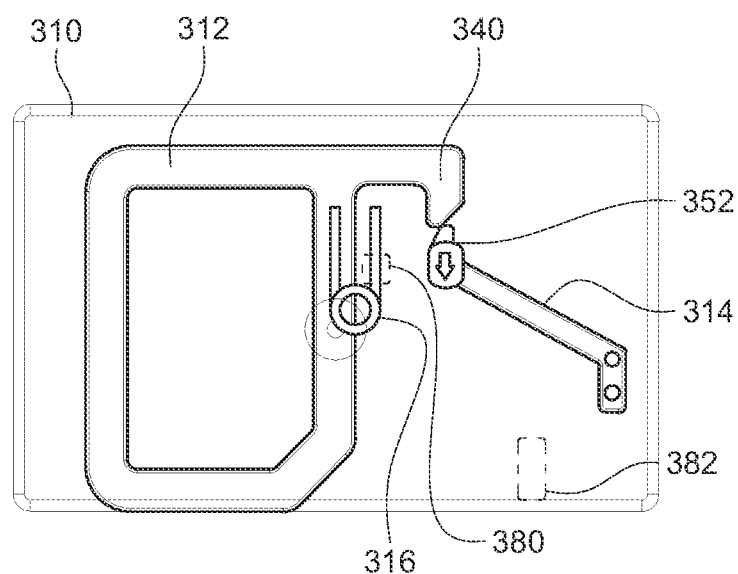
FIG. 7B shows a side view of the example support module, where the support is in the process of being locked into the collapsed position, according to certain aspects of the present disclosure.

When a user desires to collapse the support member 312 into the case 310, the user pushes on the post support 334 as shown in FIGS. 6A-6B. The force causes the support member 312 to be rotated in a clockwise direction. The user will have to apply sufficient force to overcome the spring force of the torsion spring 316 during the rotation. As shown in FIGS. 7A-7B, once the bottom support member 330 is rotated into a vertical orientation, the main hook 340 will be rotated into position to engage the secondary hook 352. Once the main hook 340 engages the secondary hook 352, the support member 312 is held in place thus compressing the torsion spring 316. The support member 312 in the collapsed position is fully stored with in the case 310.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A support module for attachment to an electronic equipment casing, the support module comprising:

a case having an exterior plate and a separate interior plate, the interior plate being parallel to the exterior plate, the interior and exterior plates having parallel bottom edges;

a support member parallel to the exterior plate and interior plate, the support member rotatably mounted between the exterior plate and the interior plate of the case, the support member having a collapsed position between the interior and exterior plates within the case and an extended position extending from the bottom edges of interior and exterior plates of the case; and a pivot arm engaging the support member in the collapsed position.

2. The support module of claim 1, further comprising a torsion spring having a first spring arm coupled to the support member and a second spring arm coupled to the pivot arm, the torsion spring providing a spring force to force the support member into the extended position.

3. The support module of claim 2, wherein the support member includes a main hook that engages a secondary hook of the pivot arm, wherein the engagement of the main hook with the secondary hook retains the support member in the collapsed position.

4. The support module of claim 3, wherein the pivot arm includes a release button, wherein pushing the release button causes the pivot arm to move and disengage the secondary hook from the main hook.

5. The support module of claim 1, wherein the support member includes a base member to engage a ground surface when the support member is in the extended position.

6. The support module of claim 5, wherein the support member includes a pivot bar positioned parallel to the base member, wherein the pivot bar includes a hole, and wherein the support member rotates around a pin inserted in the hole, the pin being attached to the exterior and interior plates of the case.

7. The support module of claim 1, wherein the interior plate includes a fastener for fastening the case to a side panel of the electronic equipment casing.

8. The support module of claim 1, wherein the electronic equipment casing holds components for operation of a 5G mobile communication system, wherein the electronic equipment casing includes a bottom panel having an input/output connector that may be accessed when the support member is in the extended position.

9. An electronic component, comprising:
a casing including two side panels and a bottom panel including at least one connector; and
a first modular support attached to one of the side panels;
a second modular support attached to the other side panel, wherein the first and second modular supports each include:
a case having an exterior plate and an interior plate, the interior plate being parallel to the exterior plate;
a support member rotatably mounted between the exterior plate and the interior plate of the case, the support member having a collapsed position within the case and an extended position extending from the case, wherein the casing is elevated when the support member is in the extended position to allow access to the bottom panel; and
a pivot arm engaging the support member in the collapsed position.

10. The electronic component of claim 9, wherein the casing includes a heat sink chassis with cooling fins extending from an exterior surface of the heat sink chassis, the heat sink chassis being positioned between the two side panels.

11. The electronic component of claim 9, wherein the casing holds components for operation of a 5G mobile communication system.

12. The electronic component of claim 9, wherein the first and second modular supports each include a torsion spring, the torsion spring having a first spring arm coupled to the support member and a second spring arm coupled to the pivot arm, the torsion spring providing a spring force to force the support member into the extended position.

13. The electronic component of claim 12, wherein the support member includes a main hook that engages a secondary hook of the pivot arm, wherein the engagement of the main hook with the secondary hook retains the support member in the collapsed position.

14. The electronic component of claim 13, wherein the pivot arm includes a release button, wherein pushing the release button causes the pivot arm to move and disengage the secondary hook from the main hook.

15. The electronic component of claim 9, wherein the support member includes a base member to engage a ground surface when the support member is in the extended position.

16. The electronic component of claim 15, wherein the support member includes a pivot bar positioned parallel to the base member, wherein the pivot bar includes a hole, and wherein the support member rotates around a pin inserted in the hole, the pin attached to the exterior and interior plates of the case.

17. The electronic component of claim 9, wherein the interior plate includes a fastener for fastening the case to one of the side panels.

18. A support module for attachment to an electronic equipment casing, the support module comprising:
a case having an exterior plate and an interior plate, the interior plate being parallel to the exterior plate;
a support member rotatably mounted between the exterior plate and the interior plate of the case, the support member having a collapsed position within the case and an extended position extending from the case;
a pivot arm engaging the support member in the collapsed position; and
a torsion spring having a first spring arm coupled to the support member and a second spring arm coupled to the pivot arm, the torsion spring providing a spring force to force the support member into the extended position.

19. The support module of claim 18, wherein the support member includes a base member to engage a ground surface when the support member is in the extended position.

20. The support module of claim 18, wherein the interior plate includes a fastener for fastening the case to a side panel of the electronic equipment casing.

* * * * *